(12) United States Patent
Bang et al.

(10) Patent No.: US 6,311,561 B1
(45) Date of Patent: Nov. 6, 2001

(54) MEDIA COMPATIBLE PRESSURE SENSOR

(75) Inventors: Christopher A. Bang, North Royalton; Marcus S. Just, Parma; Xiaofeng Yang, Willoughby Hills; Michael L. Nagy, Lakewood, all of OH (US)

(73) Assignee: Rosemount Aerospace Inc., Burnsville, MN (US)

( * ) Notice: Subject to any disclaimer, the term of this patent is extended or adjusted under 35 U.S.C. 154(b) by 0 days.

(21) Appl. No.: 09/241,273

(22) Filed: Feb. 1, 1999

Related U.S. Application Data

(63) Continuation-in-part of application No. 08/995,829, filed on Dec. 22, 1997.

(51) Int. Cl.$^7$ .................................................. G01L 19/04
(52) U.S. Cl. ............................................................ 73/708
(58) Field of Search ............................... 73/715, 716, 717, 73/718, 719, 720, 721, 722, 723, 724, 725, 726, 727, 706, 756

(56) References Cited

U.S. PATENT DOCUMENTS

| | | | |
|---|---|---|---|
| 4,023,562 | 5/1977 | Hynecek et al. | 128/205 |
| 4,222,277 | 9/1980 | Kurtz et al. | 73/721 |
| 4,287,501 | 9/1981 | Tominaga et al. | 338/42 |
| 4,563,903 | 1/1986 | Köhnlechner et al. | 73/727 |
| 4,576,049 | 3/1986 | Köhnlechner | 73/706 |

(List continued on next page.)

FOREIGN PATENT DOCUMENTS

| | | |
|---|---|---|
| 3703685 | 8/1988 | (DE) . |
| 0570624 | 11/1992 | (EP) . |
| 677726 | 4/1995 | (EP) . |
| 0710826 | 10/1995 | (EP) . |
| 0800070 | 4/1997 | (EP) . |

OTHER PUBLICATIONS

*Pressure Measurement; Products and Services for the OEM Market;* Promotional Brochure Published by Ametek, U.S. Gauge Division, PMT Products, 1996, No Month.

Marek T. Wlodarczky, *Environmentally insensitive commercial pressure sensor,* SPIE vol. 1368 Chemical, Biochemical, and Environmental fiber Sensors II (1990), pp. 121–123, No Mo.

David J. Monk, Theresa Maudie, Dennis Stanerson, John Wertz, Gordon Bitko, Jeanene Matkin, and Slobodan Petrovic, *Media Compatible packaging and Environmental Testing of Barrier Coating Encapsultated Silicon Pressure Sensors,* Solid–State Sensor and Actuator Workshop, Hilton Head, S. Carolina (Jun. 2–6, 1996) pp. 36–41.

Karsten Dyrbye, Tina Tomedahl Brown and Gert Friis Eriksen, *Packaging of physical sensors for aggressive media applications,* J. Micromech. Microeng 6 (1996) pp. 187–192, No Month.

(List continued on next page.)

*Primary Examiner*—William Oen
(74) *Attorney, Agent, or Firm*—Thompson Hine LLP

(57) ABSTRACT

A media compatible package for a pressure sensing device is made from a non-corrosive, highly chemical resistant material. The package includes a base which holds a printed circuit board having a pressure sensor mounted thereon. A sealing member is placed on the circuit board encircling the pressure sensor and a diaphragm is disposed on the sealing member. A fluid port is attached to the base and compressingly engages the diaphragm creating a sealed chamber around the pressure sensor. The sealed chamber is filled with a pressure transmissive fluid such as oil through a fill hole provided in the printed circuit board. This configuration allows the sensor package to be easily assembled with ordinary components and provides a design where all exposed surfaces of the package can be made from a highly corrosion resistive material.

20 Claims, 5 Drawing Sheets

U.S. PATENT DOCUMENTS

| | | | |
|---|---|---|---|
| 4,644,797 | 2/1987 | Ichikawa et al. | 73/706 |
| 4,656,454 | 4/1987 | Rosenberger et al. | 338/2 |
| 4,658,651 | 4/1987 | Le | 73/708 |
| 4,675,643 | 6/1987 | Tanner et al. | 338/4 |
| 4,686,764 | 8/1987 | Adams et al. | 29/592 |
| 4,691,573 | 9/1987 | Varnum et al. | 73/702 |
| 4,695,817 | 9/1987 | Kurtz et al. | 338/4 |
| 4,732,042 | 3/1988 | Adams | 73/706 |
| 4,763,098 | 8/1988 | Glenn et al. | 338/4 |
| 4,773,269 | 9/1988 | Knecht et al. | 73/706 |
| 4,784,721 | 11/1988 | Holmen et al. | 156/647 |
| 4,790,192 | 12/1988 | Knecht et al. | 73/721 |
| 4,841,777 | 6/1989 | Hershey et al. | 73/721 |
| 4,888,662 | 12/1989 | Bishop | 361/283 |
| 4,920,972 | 5/1990 | Frank et al. | 128/675 |
| 4,926,155 | 5/1990 | Colla et al. | 338/36 |
| 4,934,193 | 6/1990 | Hayata | 73/727 |
| 4,993,265 | 2/1991 | Koen et al. | 73/706 |
| 5,076,147 | 12/1991 | Hegner et al. | 92/103 |
| 5,184,107 * | 2/1993 | Mauer | 73/721 |
| 5,212,989 | 5/1993 | Kodama et al. | 73/706 |
| 5,222,397 | 6/1993 | Kodama | 73/756 |
| 5,279,164 | 1/1994 | Araki et al. | 73/708 |
| 5,307,684 | 5/1994 | Moss et al. | 73/716 |
| 5,333,507 | 8/1994 | Vogler et al. | 73/756 |
| 5,351,550 | 10/1994 | Maurer | 73/727 |
| 5,436,491 | 7/1995 | Hase et al. | 257/417 |
| 5,438,876 | 8/1995 | Lewis | 73/726 |
| 5,461,922 * | 10/1995 | Koen | 73/756 |
| 5,483,834 | 1/1996 | Frick | 73/724 |
| 5,518,951 | 5/1996 | Paytner et al. | 437/79 |
| 5,518,957 | 5/1996 | Kim | 437/182 |
| 5,522,267 | 6/1996 | Lewis | 73/726 |
| 5,581,226 | 12/1996 | Shah | 338/42 |
| 5,595,939 | 1/1997 | Otake et al. | 437/209 |
| 5,600,071 | 2/1997 | Sooriakumar et al. | 73/721 |
| 5,796,007 | 8/1998 | Panagotopulos et al. | 73/716 |
| 5,961,293 | 10/1999 | Clemmons et al. | 417/44.2 |
| 6,076,409 * | 6/2000 | Bang | 73/756 |

OTHER PUBLICATIONS

PCT International Search Report; PCT Application No. PCT/US00/02383; Filed on Jan. 28, 2000.

Notification of Transmittal of the International Search Report or the Declaration issued in PCT International Application US98/27388.

* cited by examiner

MEDIA COMPATIBLE PRESSURE SENSOR

This application is a continuation-in-part of U.S. Ser. No. 08/995,829 filed Dec. 22, 1997.

The U.S. Government has a paid-up license in this invention and the right in limited circumstances to require the patent owner to license others on reasonable terms as provided for by the terms of Contract No. #N66001-97-C-8614 awarded by the DARPA.

FIELD OF THE INVENTION

The present invention is directed to the pressure sensing arts. In particulars it is directed to a pressure sensing device which is resistant to corrosive fluids and is easily assembled.

BACKGROUND OF THE INVENTION

Pressure transducers are used in a wide range of applications. In many cases, it is desirable to measure the pressure of fluid media which may be harmful or corrosive to the transducer material, such as water, fuel, oil, acids, bases, solvents, other chemicals, and corrosive gases. There are numerous high-volume applications where a media compatible pressure transducer is highly desired but not available in any currently available technology with satisfactory durability, performance, or price characteristics. There is a need for media compatible pressure sensor packages which have substantial performance and cost advantages over existing technologies and provide new capabilities not previously realized.

Pressure is one of the most commonly measured physical variables. While pressure measuring instruments have been available for many decades, the proliferation of inexpensive solid-state silicon pressure transducers has resulted in tremendous growth in the number and different types of applications of pressure transducers. The most common pressure transducers sensors are also inherently sensitive to temperature. A temperature rise causes the internal fluid to expand. Constrained by the steel diaphragm, the pressure of the fluid rises, producing a false pressure reading. This temperature sensitivity is typically corrected with external passive or active electronic components which add to the cost of the transducer. Fourth, the stainless steel material is not satisfactory for many media applications. Stainless steel will eventually corrode in certain environments with harsh acids and bases present. In some applications, such as in the semiconductor industry and biomedical applications, even if the steel is resistant to the chemical substance in question, minute trace amounts of steel or corrosion products released into the media cannot be tolerated. Also, steel housings add substantially to the weight and size of the transducers.

Solid-state silicon pressure sensors which are not specially packaged for media compatibility are only used with air or other inert gases. Because of the shortcomings of the steel packaged sensors and the conventional silicon sensors, other kinds of packages have been devised. One approach has been to limit media exposure to the more rugged portions of the silicon sensor, allowing the media to contact the silicon diaphragm while isolating the corrosionsensitive metal portions of the sensor. This has been most readily accomplished by allowing media to contact the backside of the silicon diaphragm only. Because differential pressure is often needed, many of these methods involve arranging two pressure sensors together so that the backsides of both are used to measure a differential pressure. U.S. Patents relating to this approach include U.S. Pat. Nos. 4,695,817; 4,763,098; 4,773,269; 4,222,277; 4,287,501; 4,023,562; and 4,790,192. These approaches provide some media compatibility improvements, but are of limited usefulness since silicon corrodes in some acid or base environments. These approaches may add substantially to the sensor cost (especially if two sensors are used for one measurement application), or may be impractical to manufacture and assemble due to the unusual component orientation, assembly, bonding, sealing, and electrical interconnection requirements. The complex assembly of some of these devices is apparent from even a casual examination of the patent drawings. Another approach to exposing the silicon diaphragm only while protecting the metal regions is described in U.S. Pat. Nos. 4,656,454 and 5,184,107. These devices employ an elastomeric seal which contacts the diaphragm and separates the diaphragm and metal interconnect regions. Again, this device provides some improvement over conventional silicon pressure sensors but the elastomeric material also has significant limitations in the chemical environments it can withstand.

Silicon pressure sensors have also been coated with a protective material, such as silicone gel or parylene, to protect the device. This approach is very limited in the types of media in which it is effective, and the coating can also affect the sensor performance. A rubber membrane diaphragm has been used instead of steel for media isolation with a fill fluid. The media compatibility of a rubber device is an improvement over bare silicon but is still limited. Molded diaphragms are disadvantageous from a manufacturing standpoint for the reason that it is difficult to obtain uniform thickness in mass production.

Only a relatively small subset of pressure sensors are designed to withstand exposure to corrosive chemicals for long periods of time. These "media compatible" pressure sensors are protected by a stainless steel housing, and are more expensive than their non-media compatible counterparts, which are typically made from plastic. A stainless steel diaphragm is typically used in the media compatible sensors to provide a barrier between the pressure sensing element and the media. The volume between the steel diaphragm and the pressure sensing element is filled with a fluid, such as silicone oil. When the steel diaphragm deflects due to an externally applied pressure, the fluid transmits that pressure to the internal pressure sensing element, which undergoes a resistance or capacitance change proportional to the pressure.

SUMMARY OF THE INVENTION

In accordance with the present invention, a pressure sensing device is provided. The device includes a housing which has a fluid channel defined therethrough. A circuit board is mounted within the channel and a pressure sensor is attached to the circuit board. The pressure sensor generates a signal in response to a sensed pressure and communicates the signal to the circuit board. A sealing member is disposed on the circuit board and encloses the pressure sensor. A diaphragm is disposed on the sealing member and defines an enclosed chamber between the diaphragm and the circuit board. The pressure sensor is within the enclosed chamber. A pressure transmissive fluid fills the enclosed chamber such that a pressure applied to the diaphragm is transmitted by the pressure transmissive fluid and sensed by the pressure sensor. The circuit board, the sealing member and the diaphragm are compressively held together within the housing such that the enclosed chamber is sealed.

In accordance with another aspect of the present invention, a pressure sensing package for measuring pressure of a medium is provided. A pressure sensing device includes a circuit board, a pressure sensor, a sealing member, a diaphragm, and a pressure transmissive fluid. The pressure sensor is attached and electrically connected to the circuit board. The sealing member is disposed on the circuit board and surrounds the pressure sensor. The diaphragm is disposed on the sealing member and covers the pressure sensor such that a chamber is defined by the diaphragm, the sealing member and the circuit board. The pressure transmissive fluid fills the chamber such that a pressure exerted on the diaphragm is transmitted through the pressure transmissive fluid and sensed by the pressure sensor. A housing has a channel defined therein which allows a medium to flow into the housing. The pressure sensing device is mounted within the channel of the housing such that only the diaphragm is exposed to contact the medium. The pressure sensing device is compressively held together by the housing.

In accordance with another aspect of the present invention, a method of assembling a pressure sensor package is provided. A housing is provided and a circuit board is mounted within the housing. The circuit board has a pressure sensor attached thereon. A sealing member is placed on the circuit board. A diaphragm is placed on a sealing member where the diaphragm, the sealing member and the circuit board form a cavity and the pressure sensor is within the cavity. The diaphragm and circuit board are forced together to compress the sealing member and seal the cavity. A fill hole is provided through the circuit board and the cavity is filled with a pressure transmissive fluid through the fill hole. The fill hole is then sealed.

These and other aspects of the present invention are herein described in particularized detail with reference to the accompanying Figures wherein like reference numerals refer to like or equivalent parts or features of the various embodiments.

BRIEF DESCRIPTION OF THE FIGERES

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
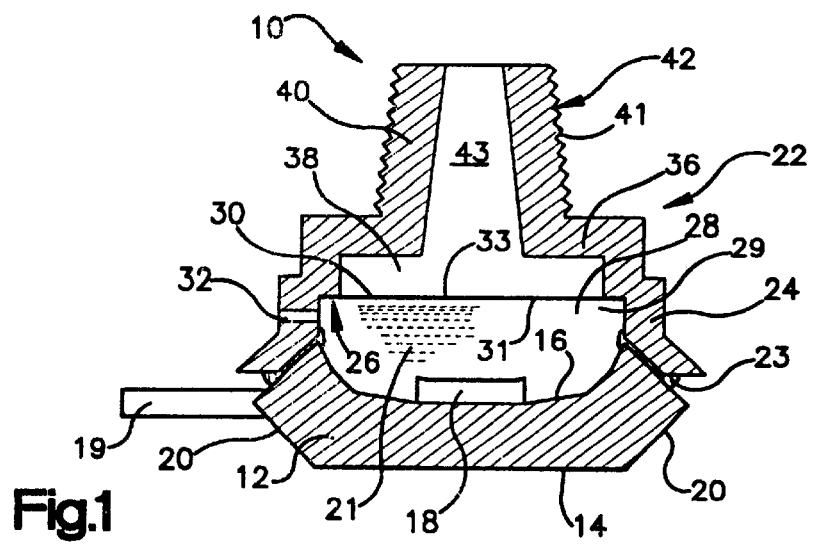
FIG. 1 is a cross-sectional view of a packaged pressure sensor constructed in accordance with the present invention.

With reference to FIG. 1, a packaged pressure sensor assembly, indicated generally at 10, includes a base 12 which has an external side 14 and an internal side 16 on which a pressure sensing device 18 (also referred to as a "pressure sensor", "pressure sensor die" or "transducer") is mounted. The pressure sensor 18 (which is typically in an encapsulation and may be pre-mounted to a base) may be any commercially available pressure sensor, such as solid tate silicon type sensors such as the Motorola MPX5050 sensor. Electrical leads 19 extend from he pressure sensor 18 through the base 12. In this embodiment, the internal side 16 of the base 12 extends upwardly around its perimeter, and outer side walls 20 are angled. A housing, indicated generally at 22, has an outer flange 24 configured for overlying attachment to the outer side walls 20 of the base 12. In this embodiment, the flange 24 is attached to the outer side walls 20 by an adhesive 23. Other types of bonding or fixed attachment may be suitably employed. An interior surface 26 of the housing 22 is generally opposed to the internal side 16 of the base 12, thereby forming a main cavity 29 in which a diaphragm and pressure sensing device are located as described below.

Attached to or integrally formed with the housing 22 is a diaphragm 30 which extends from the interior surface 26 across an interior expanse of the housing 22. With the housing 22 attached to the base 12, the diaphragm 30 is oriented generally parallel to the central area of the internal side 16 of the base, with a lower side 31 of the diaphragm 30 overlying and spaced from the pressure sensor 18, and forming a pressure transfer cavity 28, within the main cavity 29, between the diaphragm and the internal side 16 of the base. The diaphragm 30 constitutes a substantial amount of the area of the interior surface 26 of the housing overlying pressure transfer cavity 28. A fill port 32 through the wall of the housing provides access to the pressure transfer cavity 28 to fill it with a pressure-transferring medium, indicated generally at 21, such as mineral or silicone oil which transfers pressure exerted on an upper side 33 of the diaphragm to the pressure sensor 18 when the housing is attached to a fluid carrying vessel or pipeline. Once the pressure transfer cavity 28 is filled, the fill port 32 is occluded by a stopper or any suitable sealant material. The fill port allows a pressure transfer fluid to be introduced to the pressure transfer cavity 28 without pressurizing the pressure transfer cavity 28, a condition which would distort the pressure readings of the sensing die. Without the fill port 32, a pressure transfer fluid would have to be poured into the pressure transfer cavity 28 prior to attachment of the housing 22. An excessive amount of pressure transfer fluid would put a load on the diaphragm 30 which would then have to be calibrated out of the pressure sensor readings. The fill port 32 is thus critical to the assembly of a media compatible pressure sensor package with excellent pressure reading accuracy. The diaphragm 30 can be attached to the interior surface 26 of the housing 22 by adhesive, thermal welding, or ultrasonic welding.

The housing 22 further includes an upper wall 36 which generally overlies diaphragm 30 to form a pressure port 38 which extends over a substantial area of an upper side 33 of diaphragm 30. A media conduit 40 extends from wall 36 and provides a flow path in the form of a bore 43 leading to the pressure port 38. An outer surface 42 of the media conduit may be provided with threads 41 or other fastening means such as barbs or a nipple for securement of the sensor package to any structure or other housing.

The housing 22 and diaphragm 30 are preferably made of any suitable injection moldable polymer such as TEFLON® or polysulfone, to render the sensor package essentially impervious to water, detergent, oil and many industrial chemicals and gases. The polymer selected for the diaphragm 30 should have sufficient flexibility in the molded thickness to provide the desired pressure sensitivity. Preferred materials for the diaphragm 30 are TEFLON® or polyethersulfone. Of course the thickness dimension and the resultant flexibility/sensitivity properties of the diaphragm can be selectively set in the process of molding such materials in sheet form from which multiples diaphragms are cut. This ensures that the diaphragms are of close tolerance thickness in mass production, which is a paraneter critical to the accuracy of sensor readings contained in the packages.

Figure 2:
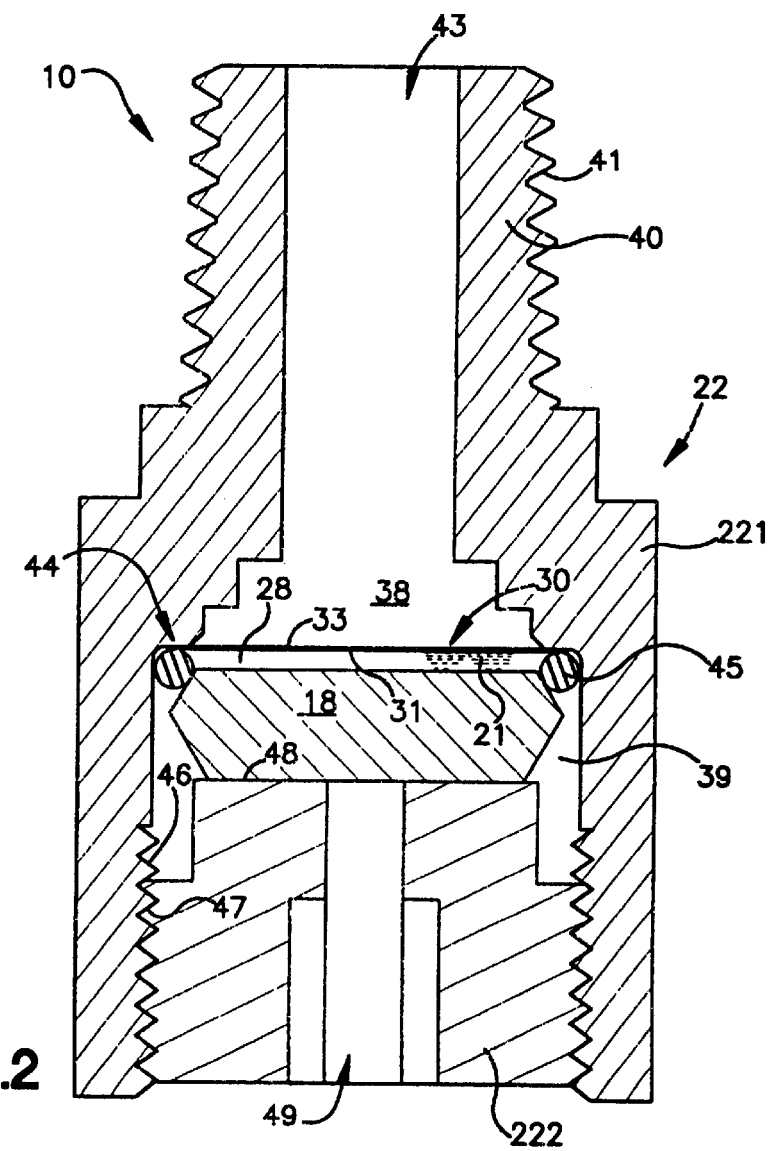
FIG. 2 is a cross-sectional view of an alternate embodiment of a packaged pressure sensor constructed in accordance with the present invention.

FIG. 2 illustrates an alternate embodiment of the media compatible packaged pressure sensor wherein the housing 22 includes a first housing piece 221 and a second housing piece 222. The first housing piece 221 includes a media conduit 40 which has an internal bore 43 which provides a fluid passageway which leads to a pressure port 38, and a somewhat larger main cavity 39. A flexible diaphragm 30, preferably made of a corrosive resistant polymeric material such as TEFLON®, is positioned within the internal cavity of first housing piece 221 adjacent to the pressure port 38, upon a ledge 44, so that one side 33 of the diaphragm faces the pressure port 38 and an opposite side 31 faces away fron the pressure port 38. The diaphragm 30 is held in this position by an O-ring seal 45 which is held in place by an edge of pressure sensor 18. The cavity 39 of the first housing piece 221 is provided with internal threads 46 which are engaged with external threads 47 on the second housing piece 222 which is advanced into cavity 39 so that an end 48 of second housing piece 222 contacts the pressure sensor 18 (mounted within its own casing or encapsulation as known in the art), holding it against O-ring 45. In other words, the rnechanical connection of the first housing piece 221 with the second housing piece 222 captures the pressure sensor die 18 in the main cavity 39. A pressure transfer cavity 28, which may be filled with a pressure transferring medium 21 such as oil, is thereby formed between the side 31 of the diaphragm and the opposing side of the pressure sensor die 18. The second housing piece 222 is also provided with an axial bore 49 to allow the pressure sensor to reference ambient pressure for gauge pressure measurements. Electrical leads (not shown) to the pressure sensor die 18 may pass through a wall of the first housing piece 221.

Figure 3:
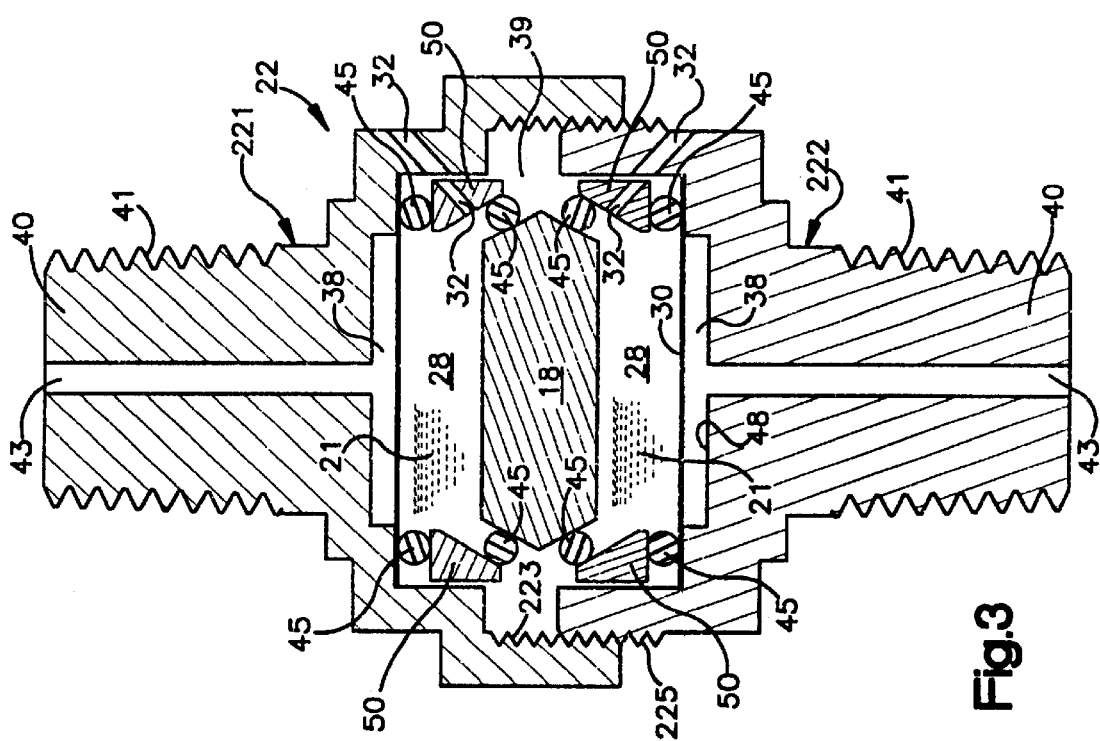
FIG. 3 is a cross-sectional view of an alternate embodiment of a packaged pressure sensor constructed in accordance with the present invention.

FIG. 3 illustrates another embodiment of the media compatible pressure sensor package of the invention. The housing 22 includes first and second pieces 221 and 222 which are screwed together, piece 221 having internal threads 223 and piece 222 having mating external threads 225. Pieces 221 and 222 each include a media port 40 and a pressure port 38. A pressure sensing device 18 is positioned within a main cavity 39 in the housing and held in place by a pair of O-rings 45 and a spacer ring 50 on each side of the pressure sensing device 18. With the pressure sensing device 18 positioned to generally equally divide the main cavity 39, two pressure transfer cavities 28 are formed, one on each side of the pressure sensing device 18. A diaphragm 30 is positioned and held between each pressure transfer pressure transfer cavity 28 and the adjacent pressure port 38 by an O-ring 45 and a spacer ring 50. The connection of the first housing piece 221 with the second housing piece 222 captures and positions the spacer rings 50 and the pressure sensing device 18 within the main cavity 39, and forms the opposed pressure transfer cavities 28.

A fluid fill port 32 extends through the wall of each housing piece 221 and 222. Corresponding fill ports 32 are also provided in the spacer rings 50 to allow the pressure transfer cavities 28 to be filled with oil or other pressure transferring medium, indicated generally at 21, after assembly of the housing. The fill ports 32 allow filling of pressure transferring media such as oil without introducing any excess pressure in either of the pressure transfer cavities. In this way the pressure in the opposing cavities 28 will be equal to atmosphere when the sensor package is sealed. This dual pressure port/transfer cavity package provides a differential sensor in which each media conduit/pressure port can be exposed to media for differential pressure sensing and measurement. If the package is designed so that the volume of fill fluid in each transfer cavity 28 is equal, then any pressure changes in the pressure transfer medium or fill fluid due to thermal expansion will be equal in both fluids and the effect will be cancelled out in the differential measurement. Electrical leads (not shown) to the pressure sensing device 18 can pass through the first or second housing pieces.

Figure 4:
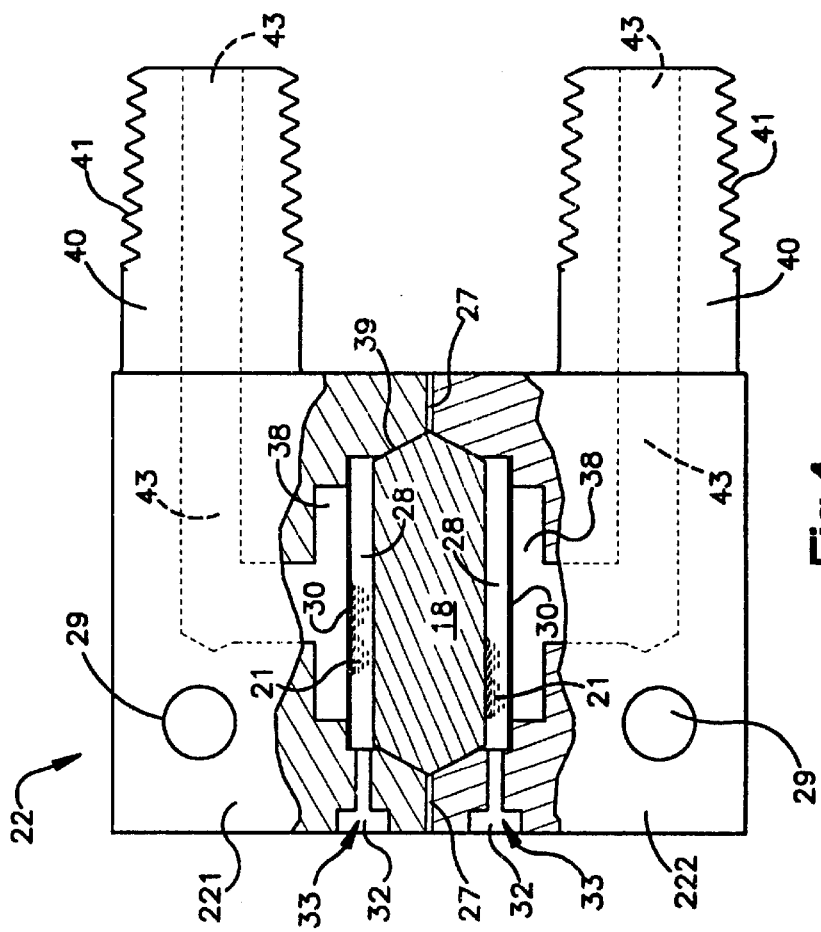
FIG. 4 is a cross-sectional view of an alternate embodiment of a packaged pressure sensor constructed in accordance with the present invention.

FIG. 4 illustrates another packaged pressure sensor of the invention wherein the housing 22 is made up of a first piece 221 and a second piece 222 which are bonded together at mating surfaces 27 to form a main cavity 39 in which a pressure sensing device 18 is centrally positioned and held in place. The attachnent of the symmetrical housing pieces 221 and 222 captures, positions and holds the pressure sensing device 18 within the main cavity 39, and fortns the opposed pressure transfer cavities 28. An opening at the mating surfaces 27 or through one of the housing pieces is provided for electrical leads (not shown) to the pressure sensing device. Pressure ports 38 are provided contiguous with the main cavity on either side of the pressure sensing device 18, and a diaphragm 30 isolates each pressure port from an adjacent pressure transfer cavity 28 on either side of the pressure sensing device 18. The diaphragms 30 are held in position within the housing by adhesive or welding or other suitable bonding of a peripheral region of the diaphragm to the interior of the cavity, or by an O-ring which can be positioned between the sensing device 18 and the interior of the housing. The media conduits 40 are in this example similarly laterally oriented relative to the housing 22, but of course can be alternatively arranged in different configurations relative to the housing. The housing 22 is preferably made of polysulfone, TEFLON® or PPS depending upon the type of media compatibility required for any particular application. The diaphragm is preferably 3 mil thick polyethersulfone (PES) fomed by stamping from film stock Fill ports 32 extend from the exterior of the housing to each of the pressure chambers 28 and can be filled with any suitable pressure transfer medium, indicated generally at 21, such as mineral oil by syringe or by vacuum backfill, and without introducing any excess pressure into the pressure transfer cavities. A recess 33 in the orifice allows a dot of glue or other sealant material to be applied to seal the fill port 32 and maintain a flush exterior surface to the housing. The rectangular shape and flat bottom of the housing facilitates part handling and is ideal for mounting on a circuit board, such as for example by mechanical fastening through mounting holes 29 provided in each housing piece. A $\frac{1}{16}$ national pipe thread (NPT) standard fitting is provided with these packages but other common fitting styles, such as a nipple or barbed fitting, or other threaded sizes, can easily be substituted. The unilateral placement of the media ports 40 relative to the housing 22 is well suited for many different types of applications. The identical structure of the two housing pieces 221 and 222 reduces manufacturing costs of the sensor package. The pressure transfer cavities 28 are equally sized in order to calibrate out any pressure differentials induced by thermal expansion. The main cavity 39 of the housing can be configured to accommodate any type of pressure sensing device such as the Motorola MPX5050 pressure sensor or any type of bare pressure sensor die.

The invention thus provides simple, low cost polymeric pressure sensor packages which isolate a pressure sensing die from hostile environments and materials, and which produce accurate pressure readings without direct contact with the pressure sensing device. The formation of the package housings from molded material with excellent media compatibility maximizes possible applications and installations of pressure sensors. The formation of fastening means such as threaded couplings on the exterior of the housings facilitates installation and integration of sensors in different environments. The use of polymeric diaphragms which are stamped from thin sheet stock of media compatible material ensures uniformity in diaphragm thickness and accurate sensor readings. The fill ports in the sensor package housings allow pressure transfer fluid to be introduced to the package after attachment of the diaphragm, thereby eliminating the problem of introducing excess pressure or air into the pressure transfer cavities.

Figure 5A:
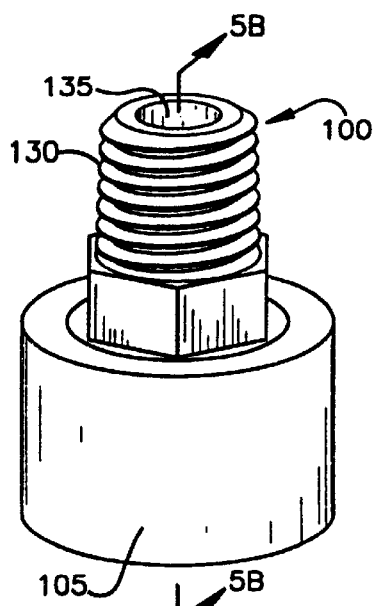
FIG. 5A illustrates a perspective view of another packaged pressure sensor in accordance with the present invention.
Figure 5B:
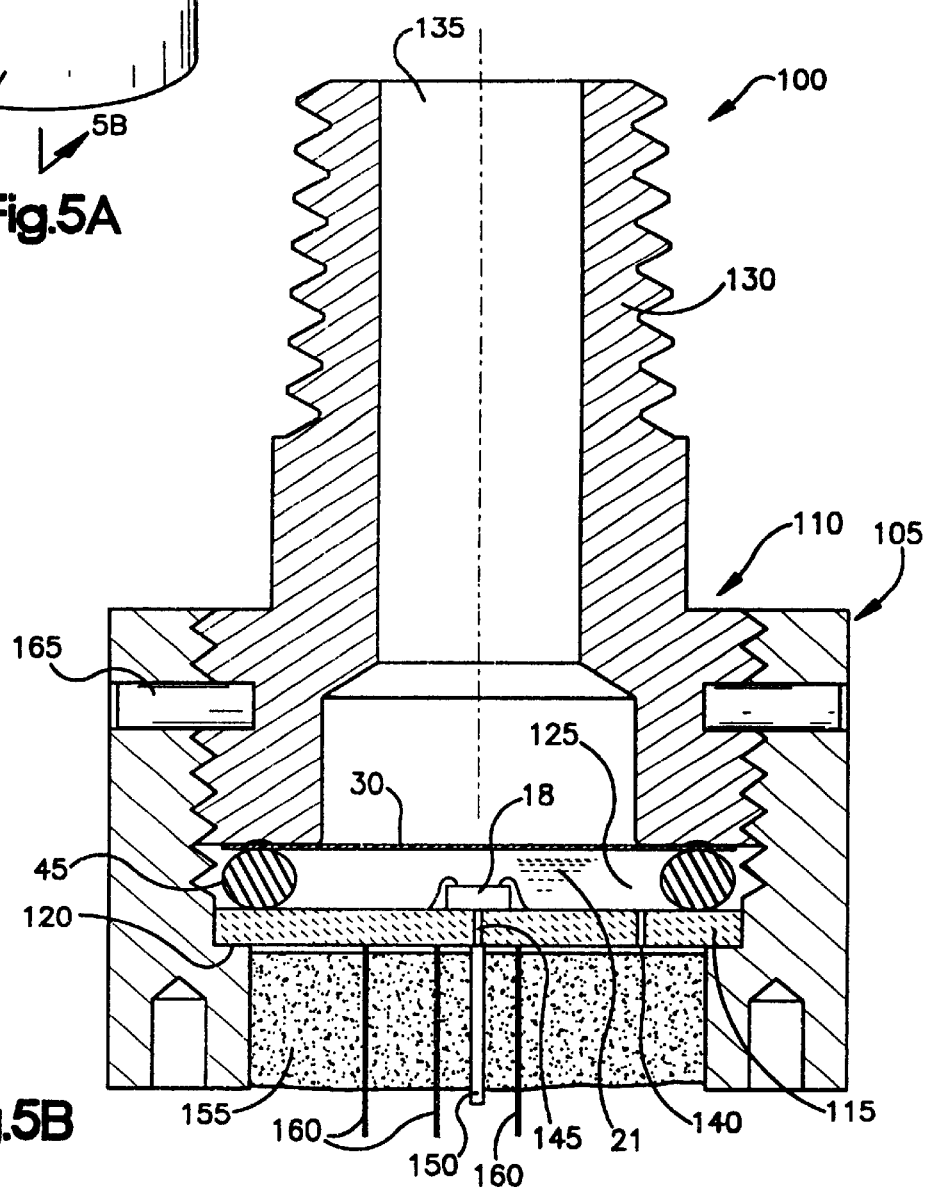
FIG. 5B is a cross-sectional view of FIG. 5A taken through section A—A—A—A.

With reference to FIGS. 5A and 5B, another pressure sensor package 100 is shown which includes a base 105. The base 105 includes a channel or chamber 110 in which a printed circuit board 115 is mounted. The circuit board can be made from an FR4 (flame retardance class) material or ceramic or any other commonly available material. A lip 120 is formed within the base 105 which holds the printed circuit board 115. Alternately, the printed circuit board can be attached to the base with any attachment process as known in the art.

The pressure sensor 18 is attached to the printed circuit board 115 such that the sensor 18 senses pressures from fluids entering the channel 135. The sensor 18 can be die-attached and wire bonded to the printed circuit board 115 as known in the art. The circuit board has two or more circuit layers which include vias formed therebetween to provide electronic connectivity and communication between the surface of the board on which the sensor 18 resides (die side) and the opposite surface (component side). As is known in the art, electrical components (not shown) form one or more circuits on the component side which are typically soldered, deposited by thick film processes or die-attached/wire bonded. The circuits can be used to trim and/or compensate for inaccuracy in a signal generated by the sensor 18, amplify the signal, convert the signal to digital, or otherwise process the signal as known by those of ordinary skill in the art.

A sealing member 45 such as an O-ring is disposed on the die side of the circuit board 115 enclosing the sensor 18. A diaphragm 30 is positioned on top of O-ring 45 thereby defining an enclosed chamber 125 in which the sensor 18 sits. A port member 130 is attached to the base 105 and includes a fluid channel 135 defined therethrough which allows a fluid being measured to contact diaphragm 30. The port member 130 engages and compresses the diaphragm 30 into O-ring 45 such that chamber 125 is fluidically sealed between the diaphragm 30 and circuit board 115. The sealed chamber 125 is filled with a pressure transmissive fluid 21 such as an oil or a synthetic compound, which transmits pressure from diaphragm 30 to sensor 18. The oil 21 is inserted into chamber 125 through a fill hole 140 provided through the circuit board 115. Preferably, the oil is vacuum filled and the fill hole 140 is sealed with, for example, solder. In addition to functioning as a compression seal, O-ring 45 functions as a filler element to reduce the oil volume in chamber 125.

With further reference to FIG. 5B, a vent hole 145 is provided through the circuit board 115 to expose one side of the sensor 18 to ambient. The vent hole 145 is a gage pressure port which allows the sensor 18 to measure sensed pressure relative to ambient. A gage pressure tube 150 is connected to the vent hole 145 to prevent accidental sealing of the vent hole. If desired, the circuit board 115 can be coated with a standard potting compound 155 for protection. However, the gage tube 150 and circuit board pins 160 should not be covered.

With the present configuration shown in FIG. 5B, assembly of the sensor package 100 is simplified. The number of internal components within base 105 is minimal since the circuit board 115 serves multiple functions. It is a containment surface for the oil chamber 125 and provides the fill hole 140 to fill the oil chamber. Additionally, the circuit board includes vias which provide electrical communication between the sensor 18 and the other side of the circuit board without allowing oil in the oil chamber 125 to leak. The oil chamber 125 is sealed by the compression between the circuit board and sealing member 45. With the circuit board 115, features can be easily added or removed without having to modify the sensor package housing or change its design. Another advantage is that since all components are on the circuit board 115, the material of the housing can be easily changed without changing the design and/or processes of manufacture.

The base 105 and port 130 include opposite and engageable threads such that the port 130 is screwed into base 105 and into engagement with diaphragm 30. The base 115 and port 130 are made of Teflon, polysulfone, or another desired material which is highly resistant to chemical attack. One reason this is possible is that the oil cavity 125 is filled and sealed through circuit board 115 rather than through the base 105. An advantage of this is that since base 105 is made from Teflon or the like, sealing a fill hole therethrough is difficult due to the highly non-adhesive nature of Teflon which may eventually cause the oil to leak.

With continued reference to FIG. 5B, an assembly of the sensor package 100 is described as follows. Circuit board 115 having an attached pressure sensor 18 is disposed into base 105 with the circuit pins 160 facing down. O-ring 45 is placed on circuit board 115. Diaphragm 30 is then placed over the O-ring 45. Port 130 is screwed into base 105 until it engages diaphragm 30 and compresses O-ring 45 thereby creating a sealed chamber 125. Gage pressure tube 150 is attached and sealed to vent hole 145. The assembly is cleaned with a degreaser and potting compound 155 is applied to protect the circuit board 115.

Optionally, to prevent disassembly of the sensor package 100, one or more holes are drilled through the base 105 and into port 130 and spring pins 165 are inserted therein. With the spring pins 165 in place, port 130 is prevented from being unscrewed out of base 105. The pins 165 may be sealed with a potting compound such as an epoxy.

In operation, the sensor package 100 is disposed in a medium whose pressure is to be measured. The medium flows into fluid channel 135 and contacts diaphragm 30 causing a pressure thereon. The pressure on the diaphragm is transmitted through the oil 21. The pressure sensor 18 senses and measures the pressure and generates a signal representing the amount of pressure measured. The signal is communicated to the circuit board 115 which processes and communicates the signal to a connected device which is interested in the pressure of the medium.

Figure 6A:
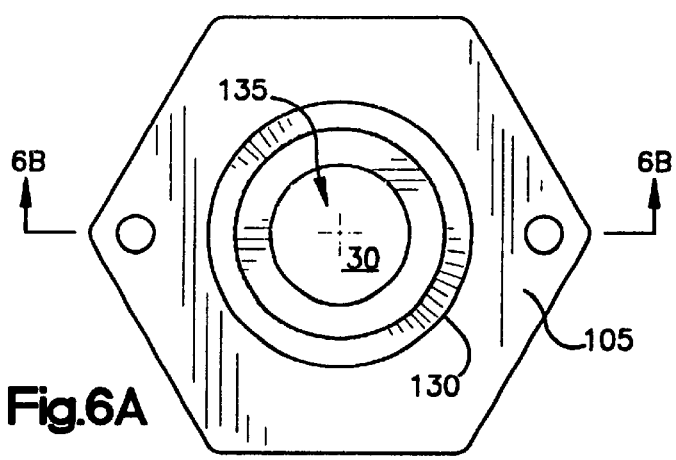
FIG. 6A is a top view of an alternative sensor package having a one piece housing.
Figure 6B:
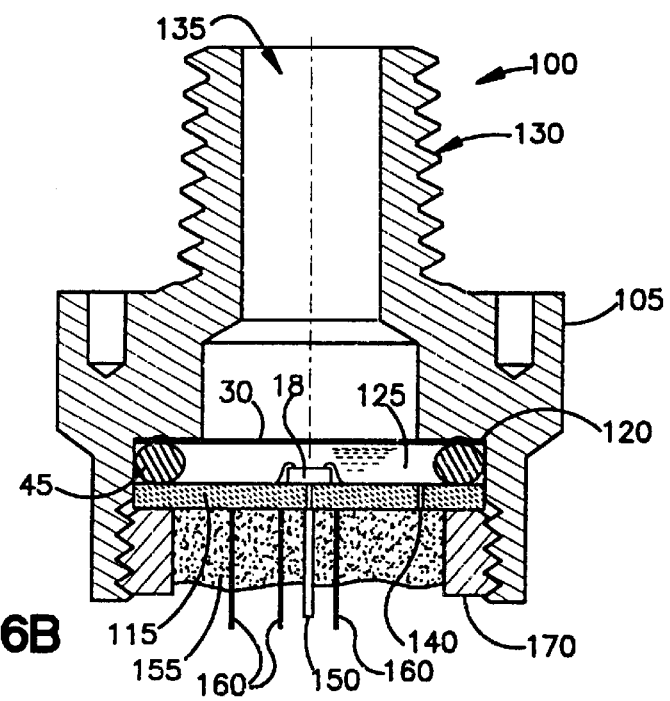
FIG. 6B is a cross-sectional view of FIG. 6A taken through section A—A.
Figure 6C:
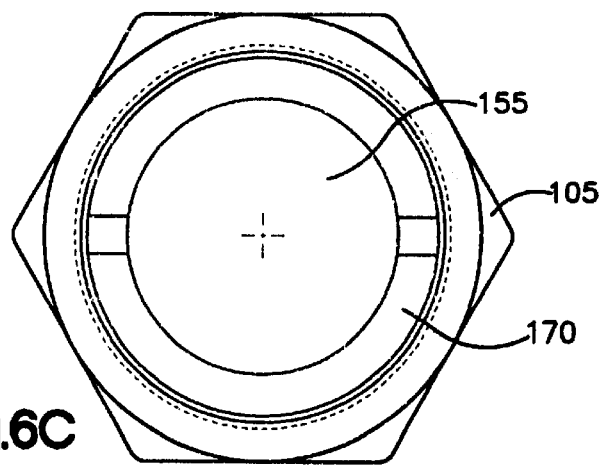
FIG. 6C is a bottom view of the one piece housing shown in FIGS. 6A and 6B.

With reference to FIGS. 6A–6C, an alternative sensor package is shown having a one piece housing. The sensor package 100 includes a one-piece base 105 which combines the base 105 and fluid port 130 shown in FIG. 5B. Similar to the configuration of FIG. 5B, a diaphragm 30, O-ring sealing member 45 and printed circuit board 115 are mounted within the housing against lip 120. A closing member 170 maintains the printed circuit board 115, O-ring 45 and diaphragm 30 compressively together, forming the oil chamber 125. The closing member 170 can be screwed, snapped, mounted, or the like, into the base 105.

Figure 7A:
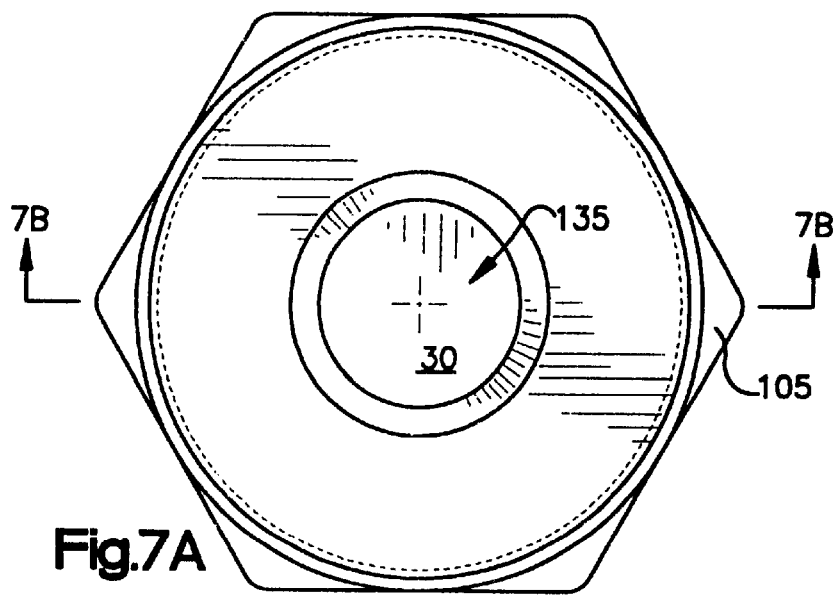
FIG. 7A is a top view of an alternative sensor package having a flush mount housing.
Figure 7B:
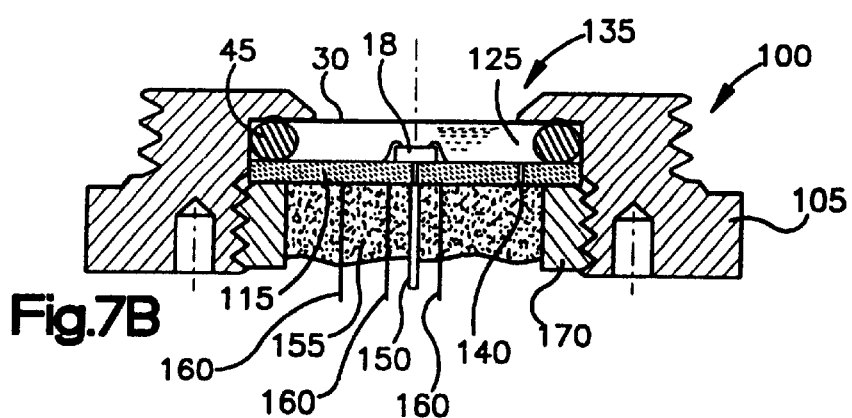
FIG. 7B is a cross-sectional view of FIG. 7A taken through section A—A.
Figure 7C:
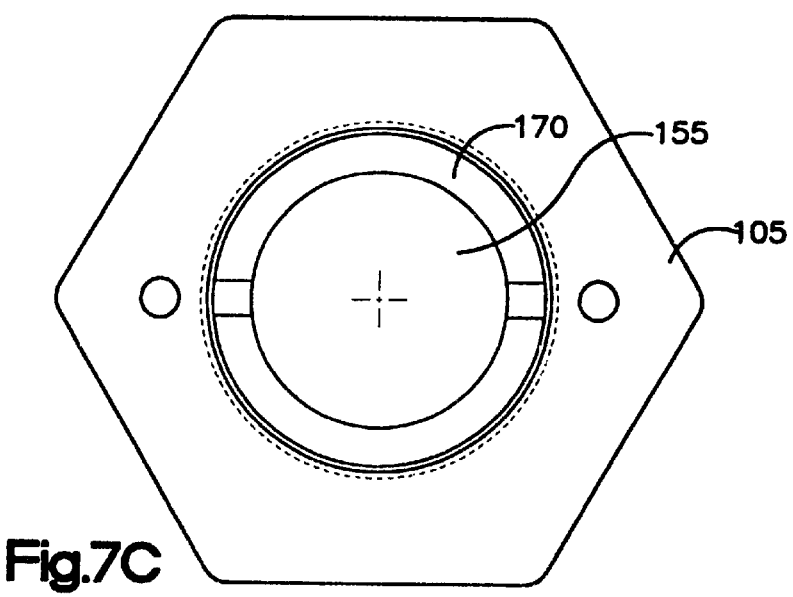
FIG. 7C is a bottom view of the flush mount housing shown in FIGS. 7A and 7B.

With reference to FIGS. 7A–7C, an alternative sensor package 100 is shown having a flush mount housing. The flush mount package is similar to the one piece housing shown in FIG. 6B. A difference is that the fluid port 130 is substantially eliminated leaving the diaphragm 30 positioned near the entrance of the fluid channel 135.

With the present sensor package, the package can be made from Teflon, polysulfone, or other highly non-corrosive materials such that it can withstand exposure to corrosive chemicals for long periods of time. With the present invention, the sensor package can be assembled using a commonly available silicon pressure sensing die and ordinary components and operations. An intermediate housing adjacent the die is eliminated, and an ordinary printed circuit board functions as both a containment surface for the oil chamber and as electrical feedthrough.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A pressure sensing device comprising:
   a housing defining a fluid channel therethrough;
   a circuit board mounted within the fluid channel;
   a pressure sensor attached to the circuit board, the pressure sensor generating a signal in response to a pressure sensed thereon and communicating the signal to the circuit board;
   a sealing member disposed on the circuit board and enclosing the pressure sensor;
   a diaphragm disposed on the sealing member defining an enclosed chamber between the diaphragm and the circuit board, the pressure sensor being within the enclosed chamber, and the diaphragm being positioned having one surface in the fluid channel;
   a pressure transmissive fluid filling the enclosed chamber such that a pressure applied to the diaphragm is transmitted by the pressure transmissive fluid and sensed by the pressure sensor; and
   the circuit board, the sealing member and the diaphragm being compressively held together within the housing such that the enclosed chamber is sealed.

2. The pressure sensing device as set forth in claim 1 wherein the housing includes a first member and second member which attach together to form the housing, the attachment of the first and second members securing the circuit board, the sealing member and the diaphragm compressively together.

3. The pressure sensing device as set forth in claim 2 wherein the first and second members of the housing each include a threaded portion such that the first and second members screw together.

4. The pressure sensing device as set forth in claim 3 further including at least one pin for securing the first and second members together to prevent disassembly.

5. The pressure sensing device as set forth in claim 1 further including a fill hole defined through the circuit board such that the enclosed chamber is filled with the pressure transmissive fluid through the fill hole.

6. The pressure sensing device as set forth in claim 1 wherein the circuit board provides electrical communication from the pressure sensor to an exterior of the housing.

7. The pressure sensing device as set forth in claim 1 wherein the housing and the diaphragm are made of a plastic.

8. The pressure sensing device as set forth in claim 7 wherein the plastic is teflon.

9. The pressure sensing device as set forth in claim 1 wherein the housing includes a flush mount configuration.

10. A pressure sensing package for measuring pressure of a medium comprising:
    a pressure sensing device including:
      a circuit board;
      a pressure sensor attached to and electrically connected to the circuit board;
      a sealing member disposed on the circuit board and surrounding the pressure sensor;
      a diaphragm disposed on the sealing member and covering the pressure sensor such that a chamber is defined by the diaphragm, the sealing member and the circuit board; and
      a pressure transmissive fluid filled in the chamber such that a pressure exerted on the diaphragm is transmitted through the pressure transmissive fluid and sensed by the pressure sensor; and
    a housing having a channel defined therein which allows a medium to flow into the housing, the pressure sensing device being mounted within the channel of the housing such that only the diaphragm is exposed to contact the medium, the pressure sensing device being compressively held together by the housing.

11. The pressure sensing package as set forth in claim 10 wherein the housing includes a base and a fluid port where the pressure sensing device is mounted within the base and the fluid port attaches to the base to secure the pressure sensing device by compression.

12. The pressure sensing package as set forth in claim 11 wherein the base includes a threaded portion and the fluid port includes a threaded portion, the base and fluid port being attached by screwing together.

13. The pressure sensing package as set forth in claim 12 wherein the base and the fluid port are secured together to prevent unthreading.

14. The pressure sensing package as set forth in claim 10 wherein the circuit board includes a fill hole defined therethrough where the pressure transmissive fluid is passed through the fill hole to fill the chamber.

15. The pressure sensing package as set forth in claim 14 wherein circuit board further includes a sealing member for sealing the fill hole.

16. The pressure sensing package as set forth in claim 10 wherein the circuit board includes a vent hole such that pressure sensed by the pressure sensor is measured relative to ambient.

17. The pressure sensing package as set forth in claim 10 wherein the chamber has a volume which is decreased by compression of the sealing member against the diaphragm and the circuit board.

18. The pressure sensing package as set forth in claim 10 wherein the sealing member is a resilient O-ring.

19. The pressure sensing package as set forth in claim 10 wherein the housing is a flush mount housing.

20. A pressure sensing device comprising:

- a housing having an inner cavity;
- a circuit board mounted in said inner cavity;
- a pressure sensor coupled to said circuit board, said pressure sensor generating an output signal in response to a sensed pressure and communicating said signal to said circuit board;
- a sealing member disposed on said circuit board and receiving said pressure sensor therein; and
- a diaphragm disposed on said sealing member, wherein said circuit board, said sealing member and said diaphragm define an enclosed chamber, said pressure sensor being located in said enclosed chamber, and wherein said enclosed chamber can receive a pressure transmissive fluid such that a pressure applied to said diaphragm is transmitted by said pressure transmissive fluid and sensed by said pressure sensor.

* * * * *